United States Patent [19]

Garofalo et al.

[11] Patent Number: 5,358,827
[45] Date of Patent: Oct. 25, 1994

[54] PHASE-SHIFTING LITHOGRAPHIC MASKS WITH IMPROVED RESOLUTION

[75] Inventors: Joseph G. Garofalo, South Orange; Robert L. Kostelak, Jr., Bernardsville; Sheila Vaidya, Watchung, all of N.J.

[73] Assignee: AT&T Bell Laboratories, Murray Hill, N.J.

[21] Appl. No.: 19,973

[22] Filed: Feb. 19, 1993

Related U.S. Application Data

[63] Continuation-in-part of Ser. No. 622,680, Dec. 5, 1990, abandoned.

[51] Int. Cl.$^5$ ............................................. G03F 7/00
[52] U.S. Cl. .................................. 430/313; 430/311; 430/323; 430/396
[58] Field of Search ............... 430/5, 296, 311, 312, 430/313, 314, 317, 318, 322, 323, 324, 329, 396

[56] References Cited

U.S. PATENT DOCUMENTS

4,895,779  1/1990  Yoshioka et al. .................. 430/5
5,045,417  9/1991  Okamoto ............................ 430/5

OTHER PUBLICATIONS

Nitayama, A. et al., "New Phase Shifting Mask with Self-Aligned Phase Shifters for a Quarter Micron Photolithography," *International Electron Device Meeting (IEDM) Technical Digest*, pp. 57–60 (3.3.1–3.3.4) Dec. 1989.

Brunner, T., "Self-Aligned Phase Shift Masks for Contacts," *SEMATECH Innovation for America's Future*, Nov. 12, 1990.

Nakagawa et al., "Fabrication of 64M Dram with i—Line Phase-Shift Lithography," *IEDM Technical Digest*, (1990).

Todokoro et al., "Self-Aligned Phase Shifting Mask for Contact Hole Fabrication," *Microelectronic Engineering*, 13 (1991) pp. 131–134.

Garofalo, J. G. et al., "Phase-Shifting Structures for Isolated Features," *SPIE vol. 1463 Optical/Laser Microlithography IV* (1991) pp. 151–166.

*Primary Examiner*—Marion E. McCamish
*Assistant Examiner*—Kathleen Duda
*Attorney, Agent, or Firm*—David I. Caplan

[57] ABSTRACT

In order to print an isolated feature having a width W in a photoresist layer using an optical radiation imaging system whose lateral magnification is equal to m, a phase-shifting mask is used having a corresponding isolated feature. In one embodiment this corresponding isolated feature has a central square portion having a refractive index $n_1$ and a thickness $t_1$, and a peripheral (rim) square-ring phase-shifting portion having a width B, as well as a refractive index $n_2$ and a thickness $t_2$, such that the phase-shift $\phi = 2\pi(n_2 t_2 - n_1 t_1)/\lambda$ of the central portion relative to the peripheral portion is equal to $\pi$ radian or odd multiple integral thereof. The width C of the central portion advantageously is selected such that mC/W is equal to at least 1.2, and preferably greater than 1.5, rather than unity. In another embodiment, the isolated feature has an opaque central portion, also of width C, and a peripheral square-ring phase-shifting portion having a width B and having a phase-shift of $\pi$ radian relative to a surrounding transparent wide area ("bright field")—in which case, advantageously the value of m(C+2B)/W is equal to less than 1/(1.2), and preferably less than 1/(1.5).

16 Claims, 6 Drawing Sheets

PHASE-SHIFTING LITHOGRAPHIC MASKS WITH IMPROVED RESOLUTION

CROSS-REFERENCE TO RELATED APPLICATION

This application is a Continuation-In-Part application of Ser. No. 07/622680 filed Dec. 5, 1990, now abandoned.

TECHNICAL FIELD

This invention relates to the fabrication of semiconductor integrated circuits and more particularly to masks for lithographically fabricating such devices. These masks are also called "reticles" especially when used in optical systems having magnifications different from unity.

BACKGROUND OF THE INVENTION

FIG. 1 shows a typical optical lithographic fabrication system 200, for delineating features in a wafer (substrate) 100, such as a semiconductor wafer. More specifically, optical radiation from an optical source 106, such as a mercury lamp, propagates through an aperture in an opaque screen 105, an optical condensing lens (or condensing lens system) 104, a mask or reticle 103, and an optical imaging lens (or imaging lens system) 102. The optical radiation emanating from the reticle 103 focused by the lens 102 on a photoresist layer 101 located on the top major surface of the wafer 100 itself or, more usually, on various layers on the top surface of the wafer 100. Thus, the pattern of the reticle 103—that is, its pattern of transparent and opaque portions—is focused on the photoresist layer 101. Depending upon whether this photoresist is positive or negative, when it is subjected to a developing process, typically a wet developer, the material of the photoresist is removed or remains at and only at areas where the optical radiation was incident. Thus, the pattern of the mask is transferred to (printed on) the photoresist. Subsequent etching processes, such as wet etching or dry plasma etching, remove selected portions of the substrate or of layer(s) of material(s) (not shown) located between the top surface of the wafer and the bottom surface of the photoresist layer, or of both the substrate and the layer(s). Portions of the substrate or of the layer(s) of material thus are removed from the top surface of the wafer 100 underlying areas where the photoresist was removed by the developing process but not underlying areas where the photoresist remains. Alternatively, ions can be spatially selectively introduced into the wafer 100 or into layer(s) of material(s) overlying the wafer. Thus, the pattern of the mask 103 is transferred to the wafer 100 or to layer(s) of material(s) overlying the wafer 100, as is desired, for example, in the art of semiconductor integrated circuit fabrication.

In fabricating such circuits, it is desirable to have as many devices, such as transistors, per wafer. Hence it is desirable to have as small a transistor or other feature size as possible, such as the feature size of a metallization stripe—i.e., its width W—or of an isolated aperture in an insulating layer which is to be filled with metal, in order to form electrical connections, for example, between one level of metallization and another. Thus, if it is desired to print the corresponding isolated feature having a width equal to W on the photoresist layer 101, there must exist a feature having a width equal to C located on the mask (reticle) 103. According to geometric optics, if this feature of width C is a simple (localized) aperture in a (wide-field) opaque layer, then the ratio $W/C = m$, where $m = L2/L1$, i.e., the image distance divided by the object distance, and where m is known as the lateral magnification. When diffraction effects become important, however, the edges of the image become fuzzy and lose their sharpness; and hence the so-called resolution of the mask features when focused on the photoresist layer 101 deteriorates.

In a paper entitled "New Phase Shifting Mask with Self-Aligned Phase Shifters for a Quarter Micron Lithography" published in *International Electron Device Meeting (IEDM) Technical Digest*, pp. 57-60 (3.3.1-3.3.4) (December, 1989), A. Nitayama et al. taught the use of masks having such features as isolated apertures transparent phase-shifting portions to achieve improved resolution—i.e., improved sharpness of the image of the mask features when focused on the photoresist layer 101. More specifically, these masks comprised suitably patterned transparent optical phase-shifting layers, i.e., layers having edges located at predetermined distances from the edges of the opaque portions of the mask. Each of these phase-shifting layers had a thickness t equal to $\lambda/2(n-1)$, where $\lambda$ is the wavelength of the optical radiation from the source 106 (FIG. 1) and n is the refractive index of the phase-shifting layers. Thus these layers introduced phase shifts (delays) of $\pi$ radian (or some other odd integral multiple of $\pi$ radian) in the optical radiation. In general, the phase shift $\phi$ that is introduced by one layer relative to another depends upon the respective thicknesses $t_1$ and $t_2$ and upon the respective refractive indices $n_1$ and $n_2$ of these layers: $\phi = 2\pi(n_2 t_2 - n_1 t_1)/\lambda$; whereby in a case where $\phi = \pi$, $n_1 = 1$, and $t_1 = t_2 = t$, it follows that $t = \lambda/2(n_2 - 1)$. By virtue of diffraction principles, the presence of these phase-shifting layers in the masks assertedly produces the desired improved resolution. Such masks are called "phase-shifting" masks.

The mask taught by A. Nitayama et al., for printing an isolated aperture feature in a resist layer located on the wafer 100, has an isolated aperture of width, say A, in an opaque layer with a phase-shifting layer located on the opaque layer. This phase-shifting layer overhangs (extends beyond) the peripheral edges of the opaque layer by a distance equal to B. Thus the phase-shifting layer extends into the aperture in the opaque layer by the distance B all around the periphery of the aperture. That is, a phase-shifting rim of width B is formed. In this way, the width C of the remaining, non-phase shifting portion of the aperture feature is equal to $A - 2B$. Nitayama et al. further taught that this width $C = A - 2B$ is to be made equal to $W/m$, where W and m are defined as above. That is to say, Nitayama et al. further taught that $C = W/m$; $Cm/W = 1$. Typically, $m = 1/5$, so that Nitayama et al. thus further taught that typically $C = 5W$. The teachings of Nitayama et al. do not result in as large a resolution improvement, if any, as is desired from the use of the phase-shifting mask. Therefore, it would be desirable to have a new teaching for phase-shifting masks that yields a larger resolution improvement for isolated aperture features.

SUMMARY OF THE INVENTION

Phase-shifting masks with improved resolution are obtained by departing from the prior teaching that $Cm/W = 1$, to wit, by making $Cm/W$ significantly greater than unity for the case of an aperture in an opaque surrounding field. More specifically, Cm/W should be equal to at least 1.2 or 1.3, advantageously at least 1.5, and preferably should be in the range of 1.6 to 2.0 or more. That is to say, in any event the mask 103 in the system 200 should be designed so that Cm/W is greater than its geometrical optics value (of 1.0). Moreover, the invention also encompasses a phase-shifting mask which has an aperture in the opaque layer and an isolated-island-layer of phase-shifting material located within this aperture, the width C of this isolated-island-layer satisfying the above criteria. Thus, the symbol C denotes any edge of phase-shifting material within the aperture in the opaque layer, whether the phase-shifting material extends inwards from the periphery of the aperture or outwards from the center of the aperture.

Alternatively, the mask can have a localized opaque area located in a wide-area clear (bright) field. In such a case the area encompassed by the width C is opaque, while the area encompassed by the rim B is again phase-shifting by $\phi = \pi$ (or some other odd integral multiple of $\pi$). In this case, improved resolution is achieved by making (C+2B)m/W significantly less than unity—more specifically by making (C+2B)m/W equal to the reciprocals of the aforementioned values of Cm/W for an aperture, namely by making (C+2B)m/W less than 1/(1.2) or 1/(1.3), advantageously less than 1/(1.5), and preferably in the range of 1/(1.6) to 1/(2.0).

The phase shifting mask can then be used as the reticle 103 in the system 200 in order to focus the pattern of the reticle on the photoresist layer 101 located overlying a semiconductor wafer 100, followed by removing portions of the photoresist layer in accordance with the resulting pattern of radiation imaged on the photoresist layer. Thus, this invention also involves a method for making a semiconductor integrated circuit. Moreover, after the photoresist layer 101 has thus been patterned, features can be defined (as by etching or ion implantation) in the wafer 100, or in a layer of material (not shown) located underneath the photoresist layer and overlying the wafer 100, in accordance with the resulting pattern of the removed portions of the photoresist layer 101.

BRIEF DESCRIPTION OF THE DRAWING(S)

This invention, together with its features, characteristics, and advantages may be better understood from the following detailed description in which.

Only for the sake of clarity, none of the drawings is drawn to any scale. Elements in different Figures which are substantially the same have been denoted by the same reference numerals.

DETAILED DESCRIPTION

Figure 1:
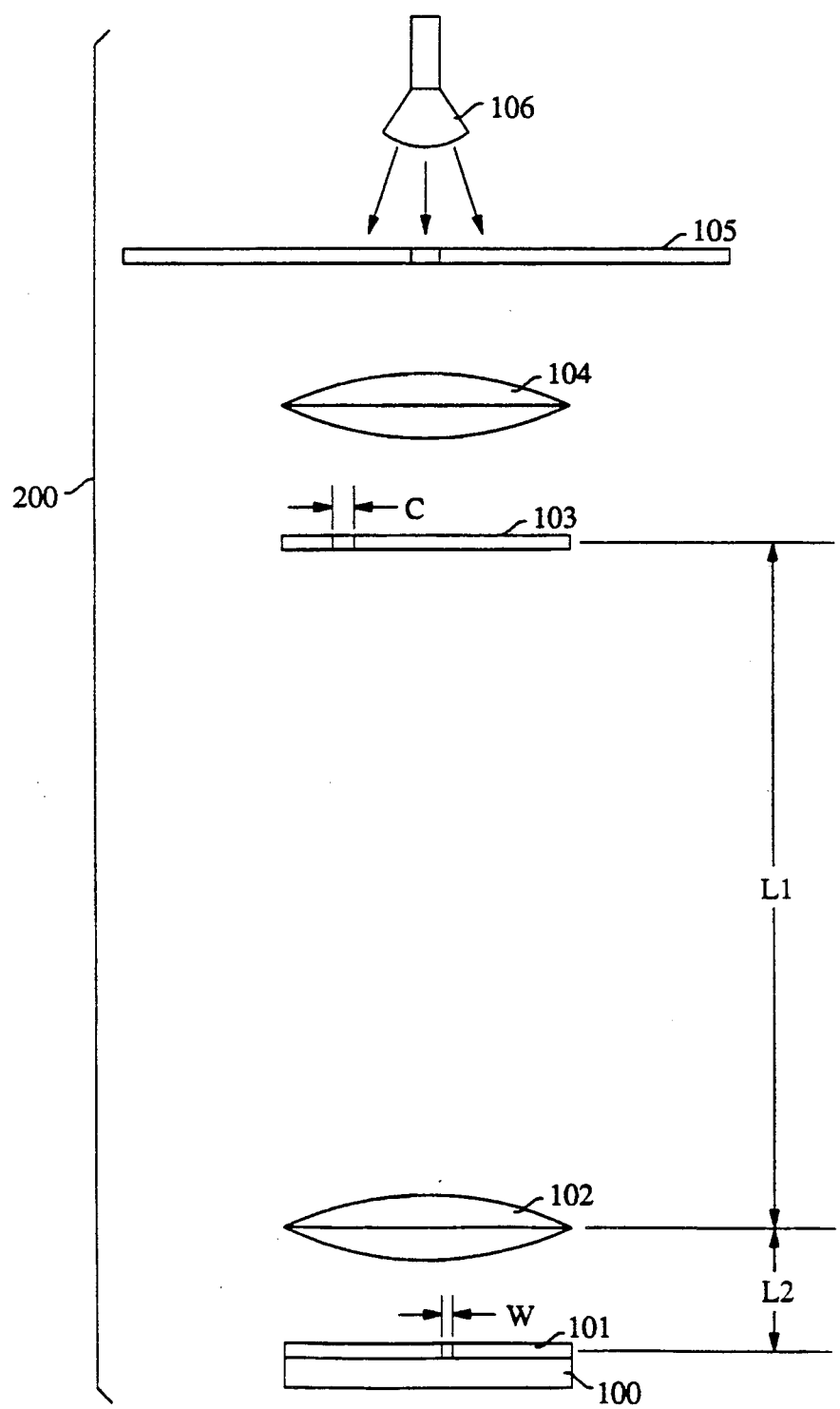
FIG. 1 is a diagram of a typical system for fabricating semiconductor integrated circuits by photolithography.
Figure 2:
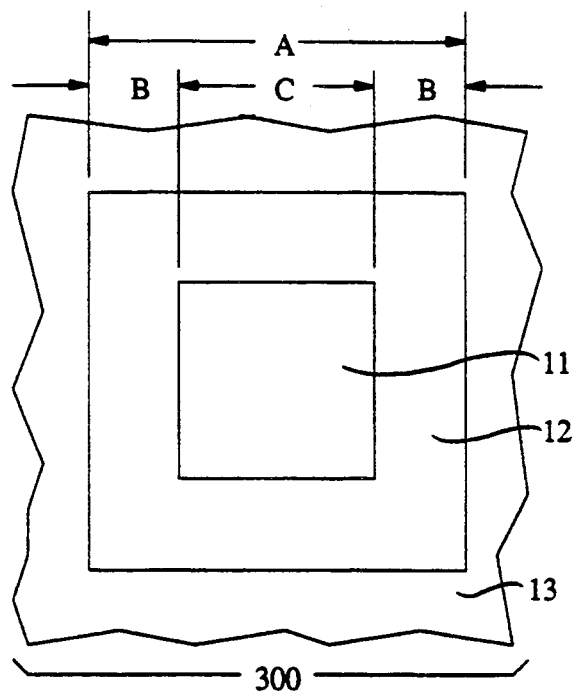
FIG. 2 is a plan view of a phase-shifting mask in accordance with a specific embodiment of the invention.

Referring now to the drawings, FIG. 2 shows the plan view of a phase-shifting mask 300 having an isolated square aperture feature. This mask is opaque in region 13 and is transparent both in square-ring peripheral-rim area or region 12 having a width B and in square central region or area 11 having a width C. Thus the regions 11 and 12 form a phase-shifting isolated square aperture feature in the mask 300. Advantageously, the optical paths through regions 11 and 12 differ from each other; therefore, optical radiation propagating through regions 11 and 12 will undergo a relative phase shift $\phi$, and hence the mask 300 is called "phase-shifting". Advantageously this phase shift $\phi$ is equal to $\pi$ radian or an odd integral multiple thereof. It is this phase-shifting which, when C and A are properly selected in terms of W (FIG. 1) in accordance with the invention, will improve the resolution of the mask, that is to say, will improve the sharpness of the edges of the diffraction pattern, corresponding to the isolated aperture feature, which is formed on the photoresist layer 101 (FIG. 1). A useful measure of such sharpness—i.e., a "figure of merit"—is the magnitude of the slope of the normalized optical intensity profile of this diffraction pattern on this photoresist layer 101, this slope being evaluated at the half-power point. Accordingly, the term "optimum values" will be used to refer to situations in which the magnitude of this slope is a maximum. This figure of merit has the advantage of being important for latitude in variations of processing parameters, such as the exposure time of the photoresist layer 101 (FIG. 1) to the optical radiation.

As used herein the term "normalized optical intensity" refers to $I(x)/I_o$, where $I(x)$ is the optical intensity at a point whose Cartesian coordinate along the surface of the photoresist layer 101 (FIG. 1) is x, and where $I_o$ is the intensity of the diffraction pattern on the photoresist layer 101 at a position where the optical intensity is a maximum (i.e., at the center of the diffraction pattern on the photoresist layer 101). Thus the term "optimum values" refers to situations in which the magnitude of $dI(x')/dx'I_o$ is a maximum, and where x' is the x coordinate at the half-power point—i.e., at the point x' where the optical intensity is equal to $I_o/2$.

The profiles $I(x)$ for various selections of mA/W can be obtained either by experimental measurements of the diffraction patterns along the surface of the photoresist layer 101 or by calculations of these diffraction patterns as predicted by electromagnetic theory.

Figure 3:
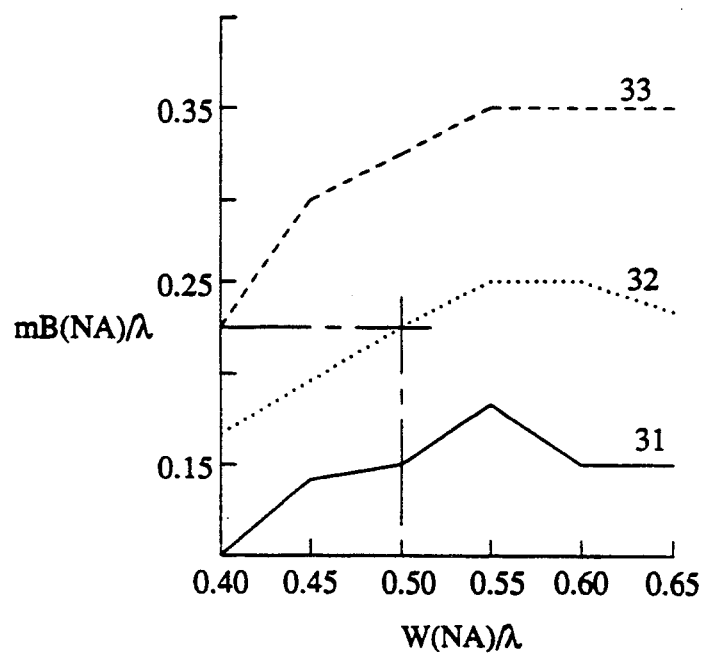
FIG. 3 depicts a family of curves, useful for understanding the invention.

Referring now to FIG. 3, the three curves 31, 32, and 33 show the optimum values of B—i.e., to be selected for B in the mask 300 (FIG. 2)—as a function of W, for the three cases A=2.00 W/m, A=2.50 W/m, and A=3.00 W/m, respectively, all for the case $\phi = \pi$ and for an optical incoherence factor of 0.3 in the optical radiation striking the mask in the optical system 200. The "incoherence factor" is equal to the ratio of the numerical aperture na of the condensor lens system 104 to the numerical aperture NA of the imaging lens system 102. Again, the term "optimum values" refers to maximum values for the magnitude of the normalized slope $dI(x')/dx'I_0$. In order to normalize these curves 31, 32 and 33—so as to make them useful for different wavelengths $\lambda$ and numerical aperture (NA) of the lens 102 (FIG. 1)—the units of the abscissa of FIG. 3 are selected to be in terms of $\lambda/(NA)$; the units of the ordinate, in terms of $\lambda/(NA)m$.

For example, in case it is desired that $W(NA)/\lambda = 0.50$, and $A = 2.50$ W/m, it is found by inspection of curve 32 that B should be selected such that $mB(NA)/\lambda$, is (at least approximately) equal to about 0.225.

Figure 4:
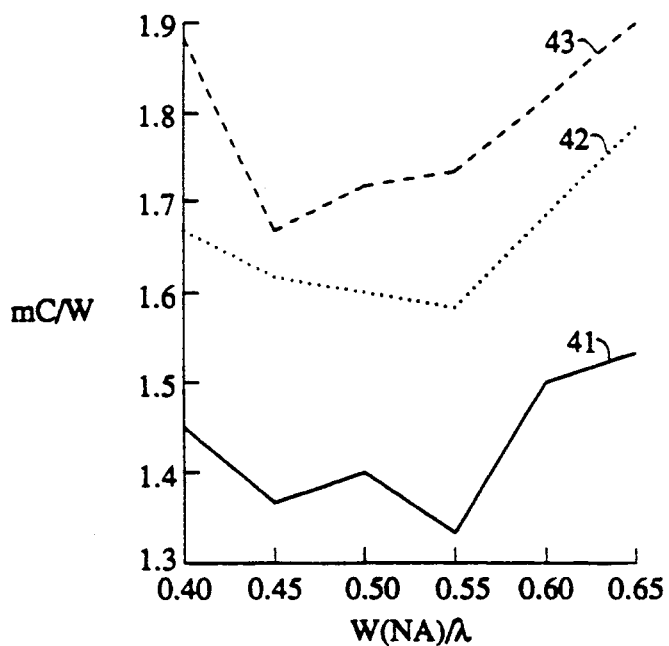
FIG. 4 depicts a family of curves, also useful for understanding the invention.

Referring now to FIG. 4, the three curves 41, 42 and 43 show the resulting values of mC/W, as a function of W, which result from the foregoing selections of B—i.e., in accordance with FIG. 3—for the three cases $A = 2.00$ W/m, $A = 2.50$ W/m, and $A = 3.00$ W/m, respectively. Since $mC/W = mA/W - 2mB/W$, these curves 41, 42 and 43 are completely determined by curves 31, 32 and 33, respectively. Again, the units of the abscissa in FIG. 4 are selected to be in terms of $(NA)/\lambda$; however, the units of the ordinate are dimensionless pure numbers. Thus, for example, in case $W(NA)/\lambda = 0.500$, it is found from curves 41, 42 and 43 that mC/W will be approximately equal to 1.40, 1.60, and 1.72 for the above three cases, respectively—i.e., where A again is selected to be equal to 2.00 W/m, 2.50 W/m, and 3.00 W/m, respectively.

Figure 5:
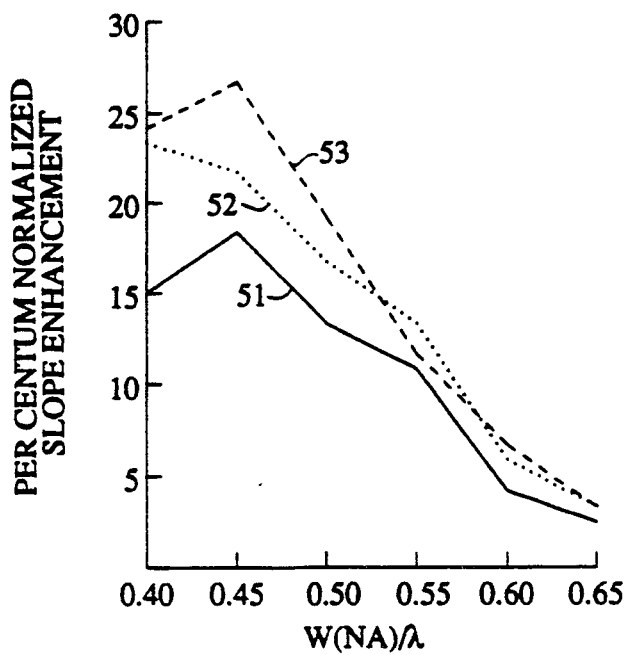
FIG. 5 depicts a family of curves, also useful for understanding the invention.

Referring now to FIG. 5, the three curves 51, 52 and 53 show the per centum of improvement in (i.e., per centum of increased value of) the normalized slope at the half-power point in the three cases $A = 2.00$ W/m, $A = 2.50$ W/m, and $A = 3.00$ W/m, respectively, by virtue of selections of B in accordance with curves 31, 32 and 33 (FIG. 3) as opposed to situations in which $B = 0$ (i.e., no phase-shifting).

It should be noted that the curves in FIG. 5 indicate that little if any improvement occurs for all cases where $W(NA)/\lambda$ is greater than about 0.6—a result which is to be expected from the consideration that as W becomes sufficiently large there is no need for masks with phase-shifting properties. Indeed, as can be seen in FIG. 3, as $W(NA)/\lambda$ increases above 0.6, the values of B level off.

It should be noted that other figures of merit can be used, such as the per centum of slope enhancement, instead of per centum of normalized slope enhancement. In such cases, curves similar to 31, 32 and 33 can be derived using computations of, or measurements of, the diffraction patterns on the photoresist layer 101 (FIG. 1). The use of per centum of slope enhancement instead of per centum of normalized slope enhancement may be desirable in cases where reduced optical exposure time of the resist layer 101—i.e., faster throughput—rather than processing parameter latitude is more important. At any rate, the values of B and hence C/W will not be strongly influenced by the above possible choices of figure of merit.

Figure 6:
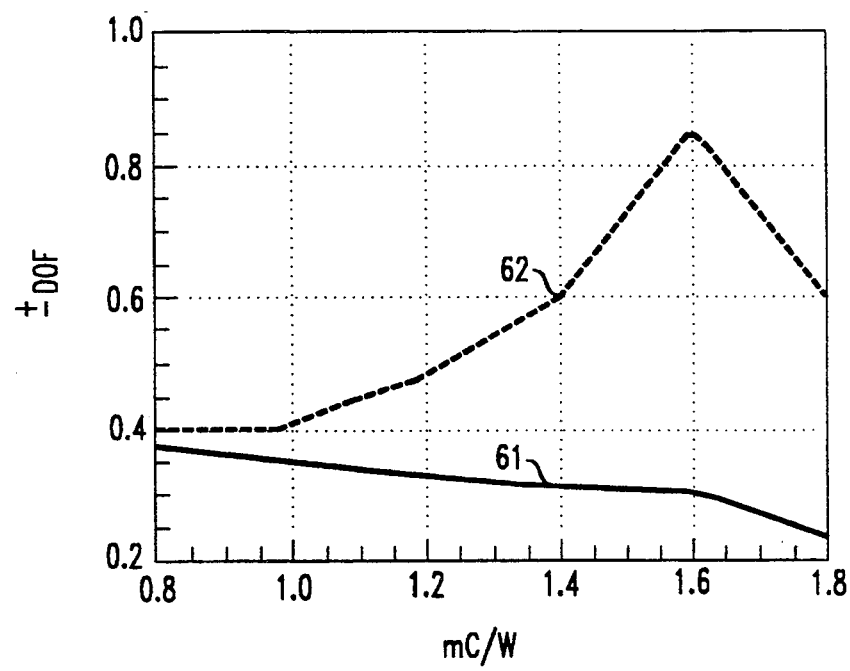
FIG. 6 depicts a pair of curves, also useful for understanding the invention.

FIG. 6 shows a pair of curves, solid curve 61 and dashed curve 62, both derived by computer simulation. In FIG. 6, the abscissa is mC/W for a square aperture 300 (FIG. 2); and the ordinate is the depth of focus ($\pm DOF$), measured in $\mu m$, of the resulting image. In plotting the solid curve 61, a rim-less mask was assumed—i.e., a mask 103 (FIG. 1) in which B (FIG. 2) is equal to zero for all points on this curve. By contrast, in plotting the dashed curve 62, the ratio B/C was selected from point-to-point so that for each point the resulting side lobes of the image were at the threshold of being printed after development of the photoresist layer 101, on which the image would be produced by the imaging lens system 102 in the optical lithographic system 200. The incoherence factor was assumed to be equal to 0.3 for all points in both curves 61 and 62.

By inspection of FIG. 6, it is clear that every point on the dashed curve 62 for a given mC/W is characterized by desirably larger depth of focus than the corresponding point (for the given mC/W) for the solid curve 61. Hence, insofar as depth of focus is concerned, a phase-shifting mask is superior to a rim-less (non-phase-shifting) mask.

It is also seen, by inspection of the dashed curve 62 in FIG. 6, that values of mC/W that are equal to or greater than approximately 1.2 correspond to larger depths of focus than do values of mC/W that are less than 1.2; and that values of mC/W that are equal to or greater than approximately 1.4 correspond to larger depths of focus than do values of mC/W that are approximately equal to 1.2, while values of mC/W that are equal to or greater than approximately 1.6 correspond to still larger depths of focus. Thus from the standpoint of depth of focus, advantageously mC/W is equal to or greater than approximately 1.2, more advantageously mC/W is equal to or greater than approximately 1.4, and even more advantageously mC/W is equal to or greater than approximately 1.6.

Figure 7:
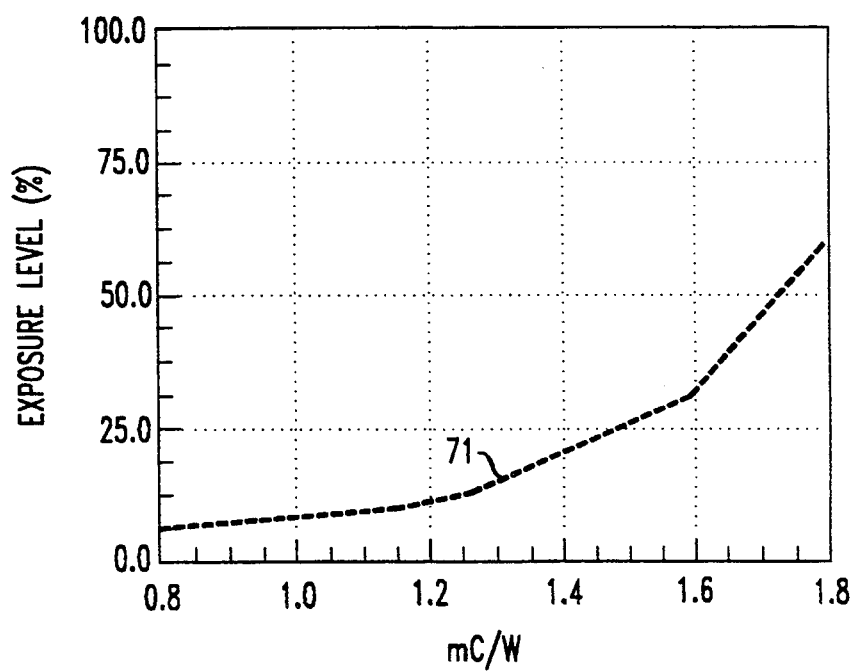
FIG. 7 depicts a curve, also further useful for understanding the invention.

FIG. 7 shows a plot, dashed curve 71 derived by computer simulation, in which the abscissa is mC/W and the ordinate is the exposure level at the edge of the image of the aperture on the photoresist layer 101 (FIG. 1), i.e., the ratio of the actual optical intensity at the desired edge of the image of a square aperture formed by a phase-shifting mask to the optical intensity of the image of an unobstructed (infinitely wide) clear field. The values for the incoherence factor and the ratio B/C that were used for constructing the curve 71 (FIG. 7) are the same as those recited above for constructing the curve 62 (FIG. 6).

By inspection of FIG. 7, it is seen that for the sake of higher exposure level—i.e., shorter exposure time and hence higher processing throughput—the value of mC/W should be approximately at least 1.2, advantageously approximately at least 1.4, and preferably approximately at least 1.6.

Figure 8:
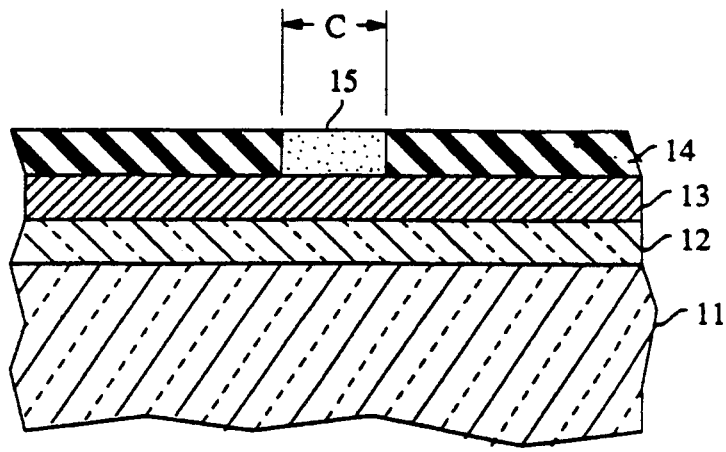
FIGS. 8-11 are side elevational views in cross section of various stages in a method of manufacturing a phase-shifting mask that is useful in the practice of the invention.
Figure 11:
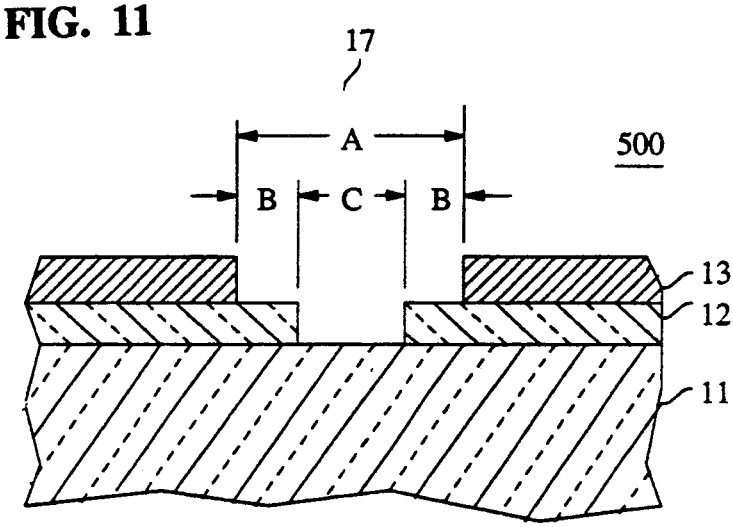

In order to fabricate the mask 300, FIG. 8 shows an early stage in an illustrative example for making of an illustrative portion of a mask 500 shown in side view cross section FIG. 11. For the sake of definiteness it will be assumed, unless otherwise stated, that the feature desired in this portion of the mask 500 is an isolated aperture and thus is the desired mask 300 (FIG. 2); but it should be understood that other features can be made, as discussed further below. Layer 14 is an electron beam resist layer, typically polybutylsulfone having a uniform thickness of about 0.5 $\mu m$, which has been bombarded by an electron beam in a limited region 15 having a predetermined desired lateral extent equal to C. This region 15 is typically square-shaped when viewed from above, as discussed more fully below. The electron bombardment dose is made sufficient to render the resist "positive"—i.e., sufficient to make the resist in the region 15 dissolve when treated with developing solution(s), as known in the art. This layer 14 has been deposited upon a major surface of an opaque layer 13, typically chromium having a uniform thickness of about 0.1 $\mu m$. Note that if the layer 13 is electrically conductive, as is chromium, advantageously this layer is grounded during the above-mentioned electron bombardment.

In case the finally desired feature in the mask being manufactured is an isolated square aperture, the region 15 forms a square trench; in case the finally desired feature is a circular aperture, the region 15 forms a circular trench. In either case, the trench has vertical walls. Thus, when viewed from above, the region 15 appears typically as a square or as a circular area. Parenthetically, it should be added that in case a cluster of line-space features is desired, the region 15 should appear as a group of parallel elongated rectangles, respectively.

Layer 12 (FIG. 8) is a chemically vapor deposited (CVD) silicon dioxide or a spun-on glass layer, typically having a refractive index of about 1.5, which has been deposited on a major surface of a quartz substrate 11, typically an amorphous quartz substrate. Thus, the thickness $\lambda/2(n-1)$ of this layer 12 is approximately equal to $\lambda/2(1.5-1)=\lambda$, i.e., to the wavelength of the optical radiation. Note that in case the source 106 (FIG. 1) radiates many different (unwanted) wavelengths, a suitable filter(s) can be inserted into the system 200, to ensure essentially monochromatic radiation and hence reduce chromatic aberration at the photoresist layer 101, as known in the art.

Figure 9:
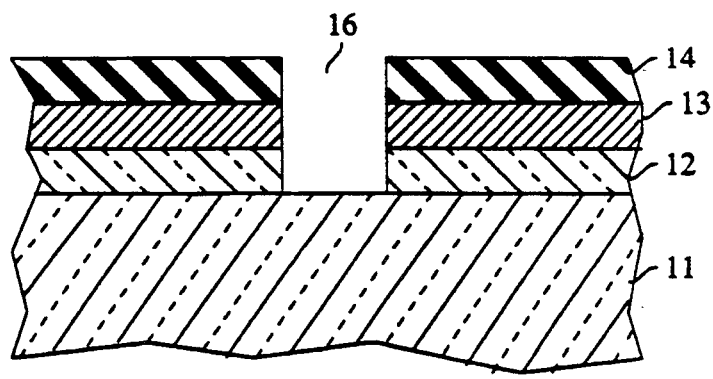

After development of the resist layer 14, as known in the art aperture (trench) 16 is formed everywhere in region 25; that is to say, this resist layer is "patterned". Using this patterned resist layer as a protective mask against etching as known in the art, the chromium layer 13 and the spun-on glass layers 12 are subjected to either isotropic or anisotropic etching. Then the patterned resist layer is removed (FIG. 3). In this way, as shown in FIG. 9, trench 16 is formed penetrating through the layers 12 and 13 in regions underlying the original region 15 of the original resist layer 14. This trench 16 advantageously does not penetrate through the substrate 11 by any optically significant amount.

For example, to etch the chromium layer 13, wet etching with an etchant such as cerric ammonium nitrate can be used; and to etch the spun-on glass layer 12, but not the quartz substrate 11, a mixture of 10:1 HF and 40% $NH_3F$, in a volume ratio of 3:50, can be used.

Figure 10:
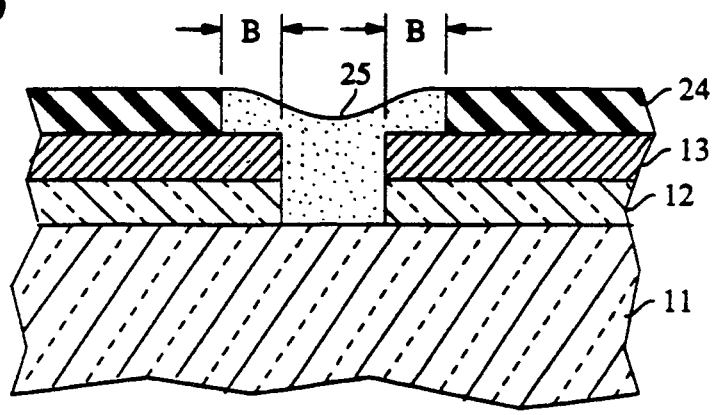

The resist layer 14 is then removed, and a new resist layer 24 (FIG. 9) is deposited all over the top surface of the mask 500 (FIG. 10) being fabricated. This new resist layer 24 is subjected to an electron beam bombardment in region 25. This electron bombardment should be carefully aligned with the earlier one, so that the boundary edges of region 25—i.e., the boundaries between regions 24 and 25 of the resist—overlap the edges of the underlying chromium layer 13 everywhere by a fixed predetermined desired distance B (FIG. 10). Advantageously, this region 25 thus extends laterally everywhere beyond the aperture 16 by the desired distance B. The resist in region 25 is then removed by using a standard developing process, while the resist in region 24 remains. Next, an etchant is applied, such as cerric ammonium nitrate, which removes the exposed portions of the chromium layer 13, but not the spun-on glass layer 12. Then the remaining resist is removed, if desired. Thus the mask 500 is achieved having a final aperture 17 (FIG. 11) which has a smaller lateral extent C in the spun-on glass layer 12 than the lateral extent $A=C+2B$ in the chromium layer 13.

Figure 12:
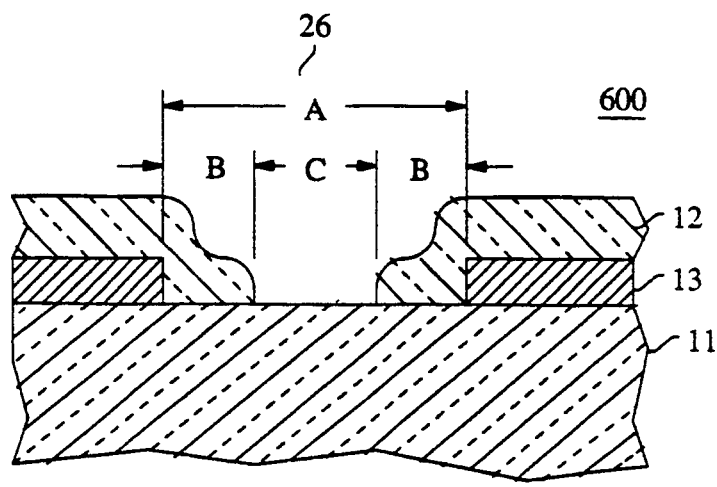
FIG. 12 is a side elevational view in cross section of yet another phase-shifting mask that is useful in the practice of the invention.

Referring now to FIG. 12, a mask 600 includes a substrate 11, a chromium layer 13 having an aperture 26 or other feature therein of overall width A, and a phase-shifting layer 12 having an aperture or other feature therein of width C located centrally within the aperture 26. This mask 600 can be manufactured by depositing and patterning the chromium layer 13 followed by depositing and patterning the phase-shifting layer 12. The phase-shifting layer 12 can be made of spun-on glass or chemically vapor deposited (CVD) silicon dioxide, the substrate 11 can be amorphous quartz. In terms of refractive indices, the mask 600 is complementary to the mask 500; but for the mask 600 the optimum values for B are the same as derived from curves 31, 32 and 33 (FIG. 3), so that the optimum values of C/W are likewise the same as derived from curves 41, 42 and 43 (FIG. 4).

Instead of or in addition to the mask 103 having a (localized) aperture located in a (wide) opaque field, the mask can have a (localized) opaque spot located in a (wide-area) bright field: that is, the area encompassed by C would be opaque, and the area encompassed by B would be phase-shifting as previously indicated in FIGS. 11 or 12. Again, for the opaque spot $A=C+2B$, but the advantageous values of A, B, and C are found by setting mA/W for the opaque spot to be equal to the reciprocal of the advantageous values of mC/W for the aperture in an opaque surrounding field.

Although the invention has been described in detail in terms of specific embodiments, various modifications can be made without departing from the scope of the invention. For example, instead of chromium other opaque materials can be used such as molybdenum silicide. Also, phase-shifts other than $\pi$ radians can be used, in accordance with diffraction principles. The shape of the aperture 16 need not be square or circular, but can be any other closed loop; and thus the shape of the aperture 26 need not be square-ring, or circular ring, but can be elongated ring. Other methods may be used for the fabricating phase-shifting mask, as disclosed in U.S. Pat. No. 5,153,083 entitled "Method of Making Phase-Shifting Lithographic Masks" and U.S. Pat. No. 5,275,896 entitled "Single-Lithographic-Exposure Phase-Shifting Patterned Lithographic Masks". Moreover, the layer 12 as a separate layer is not needed in case the etch rate of the substrate 11 can be controlled so that the depth of its etching is uniform across its major surface, typically within ±5 per centum. In such cases, a top layer (portion) of the substrate 11 itself serves as the layer 12.

We claim:

1. A method for printing in a photoresist layer an isolated aperture feature having a width W, using an optical focusing system having a lateral magnification m that focuses onto the photoresist layer the optical radiation emanating from an isolated phase-shifting mask feature located in a reticle comprising the steps of directing the optical radiation onto the reticle, the phase-shifting mask feature having a central transparent portion located in a dark field or having a central opaque portion located in a bright field, respectively, of width C and having a peripheral rim portion of width B that imparts a phase shift to the radiation propagating therethrough which is different from the phase shift imparted to the radiation by the central portion; and developing the photoresist layer sufficiently to form the feature having a width W in the photoresist layer such that the ratio mC/W is equal to at least 1.2 in a dark field or in which the ratio m(C+2B)W is less than 1/(1.2) in a bright field.

2. The method of claim 1 in which the central and peripheral portions have respective thicknesses and refractive indices that in propagating through these respective portions the optical radiation undergoes a relative phase shift of $\pi$ radian.

3. The method of claim 2 in which mC/W is equal to at least 1.4 in a dark field or in which m(C+2B)/W is less than 1/(1.4) in a bright field.

4. The method of claim 3 in which mC/W is equal to at least 1.6 in a dark field or in which m(C+2B)/W is less than 1/(1.6) in a bright field.

5. The method of claim 1 in which mC/W is equal to at least 1.4 in a dark field or in which m(C+2B)/W is less than 1/(1.4) in a bright field.

6. The method of claim 5 in which mC/W is equal to at least 1.6 in a dark field or in which m(C+2B)/W is less than 1/(1.6) in a bright field.

7. The method of claim 1 in which mC/W is equal to at least 1.3 in a dark field or in which m(C+2B)/W is less than 1/(1.3) in a bright field.

8. The method of claim 7 in which mC/W is equal to at least 1.5 in a dark field or in which m(C+2B)/W is less than 1(1.5) in a bright field.

9. A method for making a semiconductor integrated circuit which comprises the step recited in claim 1 followed by removing portions of the photoresist layer in accordance with the resulting pattern of radiation imaged on the photoresist layer and by defining features in a layer located underneath the photoresist layer in accordance with the resulting pattern of removed portions of the photoresist layer.

10. A method for making a semiconductor integrated circuit which comprises the step recited in claim 2 followed by removing portions of the photoresist layer in accordance with the resulting pattern of radiation imaged on the photoresist layer and by defining features in a layer located underneath the photoresist layer in accordance with the resulting pattern of removed portions of the photoresist layer.

11. A method for making a semiconductor integrated circuit which comprises the step recited in claim 3 followed by removing portions of the photoresist layer in accordance with the resulting pattern of radiation imaged on the photoresist layer anti by defining features in a layer located underneath the photoresist layer in accordance with the resulting pattern of removed portions of the photoresist layer.

12. A method for making a semiconductor integrated circuit which comprises the step recited in claim 4 followed by removing portions of the photoresist layer in accordance with the resulting pattern of radiation imaged on the photoresist layer followed by defining features in a layer located underneath the photoresist layer in accordance with the resulting pattern of removed portions of the photoresist layer.

13. A method for making a semiconductor integrated circuit which comprises the step recited in claim 5 followed by removing portions of the photoresist layer in accordance with the resulting pattern of radiation imaged on the photoresist layer and by defining features in a layer located underneath the photoresist layer in accordance with the resulting pattern of removed portions of the photoresist layer.

14. A method for making a semiconductor integrated circuit which comprises the step recited in claim 6 followed by removing portions of the photoresist layer in accordance with the resulting pattern of radiation imaged on the photoresist layer and followed by defining features in a layer located underneath the photoresist layer in accordance with the resulting pattern of removed portions of the photoresist layer.

15. A method of making a semiconductor integrated circuit which comprises the steps recited in claim 7 followed by defining features in a layer located underneath the photoresist layer in accordance with the resulting pattern of removed portions of the photoresist layer.

16. A method of making a semiconductor integrated circuit which comprises the steps recited in claim 8 followed by defining features in a layer located underneath the photoresist layer in accordance with the resulting pattern of removed portions of the photoresist layer.

* * * * *